(12) United States Patent
Nabekura et al.

(10) Patent No.: US 8,158,987 B2
(45) Date of Patent: Apr. 17, 2012

(54) LIGHT-EMITTING DIODE AND METHOD FOR FABRICATION THEREOF

(75) Inventors: Wataru Nabekura, Chichibu (JP); Ryouichi Takeuchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/028,370

(22) Filed: Feb. 16, 2011

(65) Prior Publication Data

US 2011/0133238 A1    Jun. 9, 2011

Related U.S. Application Data

(62) Division of application No. 12/158,914, filed as application No. PCT/JP2006/326299 on Dec. 22, 2006, now Pat. No. 7,915,619.

(60) Provisional application No. 60/754,894, filed on Dec. 30, 2005, provisional application No. 60/754,895, filed on Dec. 30, 2005, provisional application No. 60/754,320, filed on Dec. 29, 2005.

(30) Foreign Application Priority Data

Dec. 22, 2005 (JP) .................. 2005-369334
Dec. 22, 2005 (JP) .................. 2005-369620
Dec. 22, 2005 (JP) .................. 2005-369996

(51) Int. Cl.
*H01L 27/15* (2006.01)
*H01L 29/26* (2006.01)
*H01L 21/00* (2006.01)

(52) U.S. Cl. ............. 257/79; 257/94; 257/E33.002; 257/E33.005; 257/E33.006; 438/22; 438/24; 438/25; 438/46

(58) Field of Classification Search ............. 438/22, 438/24, 25, 29, 30, 46, 47; 257/79, 94, 95, 257/96
See application file for complete search history.

(56) References Cited

U.S. PATENT DOCUMENTS 6,395,572 B1    5/2002  Tsutsui et al.
(Continued)

FOREIGN PATENT DOCUMENTS

JP    58-34985 A    3/1983
(Continued)

OTHER PUBLICATIONS

Hosokawa, Y. et al, "High-power ohmic-electrodes dispersive AlGaInP double-hetero structure yellowish-green light-emitting diodes", Journal of Crystal Growth, 2000, vol. 221, pp. 652-656.

(Continued)

Primary Examiner — Hsien Ming Lee
(74) Attorney, Agent, or Firm — Sughrue Mion, PLLC

(57) ABSTRACT

A transparent-substrate light-emitting diode (10) has a light-emitting layer (133) made of a compound semiconductor, wherein the area (A) of a light-extracting surface having formed thereon a first electrode (15) and a second electrode (16) differing in polarity from the first electrode (15), the area (B) of a light-emitting layer (133) formed as approximating to the light-extracting surface and the area (C) of the back surface of a light-emitting diode falling on the side opposite the side for forming the first electrode (15) and the second electrode (16) are so related as to satisfy the relation of A>C>B. The light-emitting diode (10) of this invention, owing to the relation of the area of the light-emitting layer (133) and the area of the back surface (23) of the transparent substrate and the optimization of the shape of a side face of the transparent substrate (14), exhibits high brightness and high exoergic property never attained heretofore and fits use with an electric current of high degree.

14 Claims, 8 Drawing Sheets

U.S. PATENT DOCUMENTS

| | | |
|---|---|---|
| 7,105,859 B2 * | 9/2006 | Yamamoto et al. ............ 257/95 |
| 2002/0053872 A1 | 5/2002 | Yang et al. |
| 2003/0218172 A1 | 11/2003 | Sugawara et al. |
| 2006/0273324 A1 | 12/2006 | Asai et al. |

FOREIGN PATENT DOCUMENTS

| | | |
|---|---|---|
| JP | 63-28508 B2 | 6/1986 |
| JP | 3-227078 A | 10/1991 |
| JP | 6-302857 A | 10/1994 |
| JP | 2588849 B2 | 12/1996 |
| JP | 9-36427 A | 2/1997 |
| JP | 2000-299494 A | 10/2000 |
| JP | 2001-24222 A | 1/2001 |
| JP | 3230638 B2 | 9/2001 |
| JP | 2002-246640 A | 8/2002 |
| JP | 2002-368261 A | 12/2002 |
| JP | 2003-344788 A | 12/2003 |
| JP | 2004-289047 A | 10/2004 |
| JP | 2004-297056 A | 10/2004 |
| TW | 474034 | 1/2002 |
| WO | 2004/082035 A1 | 9/2004 |
| WO | 2005062392 A1 | 7/2005 |
| WO | 2007/083829 A1 | 7/2007 |

OTHER PUBLICATIONS

Foreign Office Action dated Jun. 23, 2010 in Taiwanese Patent Application No. 095148554.

* cited by examiner

LIGHT-EMITTING DIODE AND METHOD FOR FABRICATION THEREOF

CROSS REFERENCE TO RELATED APPLICATIONS

This application is a Divisional of U.S. application Ser. No. 12/158,914 filed Oct. 7, 2008, which is a 371 of PCT/JP2006/326299, filed Dec. 22, 2006, and claiming priority from Provisional Application Nos. 60/754,894, filed Dec. 30, 2005, 60/754,895, filed Dec. 30, 2005, and 60/754,320, filed Dec. 29, 2005, and Japanese Patent Application Nos. JP 2005-369334, JP 2005-369620, and JP 2005-369996, all filed Dec. 22, 2005. The above-noted applications are incorporated herein by reference in their entireties.

TECHNICAL FIELD

This invention relates to a transparent-substrate light-emitting diode provided with a light-emitting layer made of a compound semiconductor, and furnished with a light-extracting surface having formed thereon a first electrode and a second electrode possessing polarity different from the first electrode. More particularly, this invention relates to a light-emitting diode excelling in exoergic property and exhibiting high brightness and to a method for the fabrication thereof.

BACKGROUND ART

With the object of imparting high brightness to light-emitting diodes, the method of relying on the shape of a device for enhancement of the light-extracting efficiency has been in use heretofore. In the device structure that has electrodes each formed on the first surface and the back surface of a semiconductor light-emitting diode, for example, the method for imparting high brightness by the shape of a side face has been proposed (refer to JP-B SHO 63-28508, U.S. Pat. No. 6,229,160 and JP-A HEI 3-227078, for example).

As a Light-Emitting Diode (LED) capable of emitting a visible light in a red, orange, yellow or yellowish green color, compound semiconductor LEDs provided with a light-emitting layer made of aluminum-gallium-indium phosphide (($Al_XGa_{1-X})_YIn_{1-Y}$ P; in which $0 \leq X \leq 1$ and $0 < Y \leq 1$) have been known heretofore. In the LEDs of this kind, the light-emitting part provided with the light-emitting layer that is made of ($Al_XGa_{1-X})_YIn_{1-Y}$P; in which $0 \leq X \leq 1$ and $0 < Y \leq 1$) is generally impervious optically to the light emitted from the light-emitting layer and is mechanically formed on the substrate material, such as gallium arsenide (GaAs), which has no appreciable strength.

Recently, for the purpose of obtaining a visible LED exhibiting as high brightness as possible and with the object of further enhancing the mechanical strength of a device as well, therefore, the techniques for configuring a junction-type LED by removing an impervious substrate material, such as GaAs, and thereafter joining by way of innovation a backing layer made of a transparent material capable of transmitting emitted light and excellent in mechanical strength more than ever have been disclosed (refer to Japanese Patent No. 3230638, JP-A HEI 6-302857, JP-A 2002-246640, Japanese Patent No. 2588849 and JP-A SHO 58-34985, for example).

Then, for the purpose of obtaining a visible LED of high brightness, the method that enhances the light-extracting efficiency by dint of the shape of device has been finding acceptance. As one example, in the device structure having electrodes formed each on the first surface and the back surface of a semiconductor light-emitting diode, the technique that relies on the side structure for enhancing high brightness has been disclosed (refer to U.S. Pat. No. 6,229,160 cited above and JP-A SHO 58-34985, for example).

The conventional technique has proposed numerous shapes for devices so configured as to have electrodes formed each on the first surface and the back surface of a light-emitting diode but has not studied the exoergic property exhibited by such a device when the device is used with an electric current of high level. Particularly, the light-emitting diode containing an AlGaInP and gallium nitride-based light-emitting layer provided on a light-extracting surface thereof with two electrodes is inferior in exoergic property to the device structure having electrodes disposed on the back surface because it has no electrode disposed on the back surface. It is known that the deficiency of the exoergic property results in elevating the temperature of the light-emitting layer, lowering the light-emitting efficiency and degrading the brightness.

The structure of the device using a transparent-substrate AlGaInP light-emitting layer and having two electrodes formed on a light-extracting surface entails such problems as complicating the shape, failing to optimize the electrode disposition, the side face condition and the back surfaces of the light-emitting layer and device and not acquiring high brightness and sufficient exoergic property.

While the junction-type LED has enabled provision of an LED of high brightness, the need for an LED exhibiting still higher brightness has persisted. This invention has been proposed in view of the problems mentioned above. In a light-emitting diode possessing two electrodes on a light-extracting surface, this invention is aimed at providing a light-emitting diode that excels in exoergic property, exhibits a high light-extracting efficiency and possesses high brightness.

It is clear even from the conventional technique that the shape of the side face of a light-emitting diode is related to the extraction of light from the diode. In the structure having a light-emitting surface in the upper part, when the angle of inclination is increased for the purpose of rendering the effect of the shape of the side face conspicuous, the increase results in decreasing the area of the back surface, lowering the exoergic property and degrading the property of brightness in the region of high degree of electric current. When the light-emitting layer is made smaller and the area of the back surface is made larger for the purpose of enhancing the exoergic property, the problem of cost ensues because the expensive light-emitting layer incurs a great loss. When the light-emitting layer is approximated to the back surface, the structure that possesses two electrodes on one surface cannot be assembled by the ordinary wire bonding process.

The present inventors, as a result of a comprehensive study pursued on the shape and the back surface of a light-emitting diode, have discovered that the structure and area of the back surface, the area of the light-emitting layer, the shape of the side face and the coarsening of the back surface dictate an important consideration and eventually perfected this invention by finding out the optimum device structure and the stable method of fabrication. Specifically, for the purpose of accomplishing the object described above, this invention has been accomplished.

DISCLOSURE OF THE INVENTION

The first aspect of this invention consists in a light-emitting diode possessing a transparent substrate and a light-emitting layer made of a compound semiconductor, wherein an area (A) of a light-extracting surface having formed thereon a first electrode and a second electrode differing in polarity from the first electrode, an area (B) of the light-emitting layer formed as approximating to the light-extracting surface and an area (C) of a back surface of the light-emitting diode falling on a side opposite a side for forming the first electrode and the second electrode are so related as to satisfy a relation of formula (1).

$$A > C > B \quad (1)$$

The second aspect of this invention includes the configuration of the first aspect, wherein the light-emitting layer has a composition of the formula $(Al_XGa_{1-X})_YIn_{1-Y}P$; wherein $0 \leq X \leq 1$ and $0 < Y \leq 1$, and the transparent substrate has a heat transfer coefficient of 100 W/m·k or more.

The third aspect of this invention includes the configuration of the first or second aspect, wherein the transparent substrate possesses a side face comprising a first side face approximating to the light-emitting layer and a second side face approximating to a back surface of the transparent substrate and wherein the first side face has an angle of inclination smaller than an angle of inclination of the second side face.

The fourth aspect of this invention includes the configuration of the third aspect, wherein the first side face is perpendicular and the second side face is inclined.

The fifth aspect of this invention consists in a light-emitting diode comprising a compound semiconductor layer furnished with a light-emitting part containing a light-emitting layer having a composition of formula $(Al_XGa_{1-X})_YIn_{1-Y}P$; in which $0 \leq X \leq 1$ and $0 < Y \leq 1$, a transparent substrate having the compound semiconductor layer joined thereto and a main light-extracting surface having formed thereon a first electrode and a second electrode differing in polarity from the first electrode, wherein the second electrode is formed on the compound semiconductor layer exposed to a side opposite the first electrode and the transparent substrate has a side face comprising a first side face roughly perpendicular to the light-emitting surface of the light-emitting layer on a side approximating to the light-emitting layer and a second side face inclined to the light-emitting surface on a side distant from the light-emitting layer.

The sixth aspect of this invention consists in a light-emitting diode comprising a compound semiconductor layer furnished with a light-emitting part containing a light-emitting layer having a composition of formula $(Al_XGa_{1-X})_YIn_{1-Y}P$; in which $0 \leq X \leq 1$ and $0 < Y \leq 1$, a transparent substrate having the compound semiconductor layer joined thereto and a main light-extracting surface having formed thereon a first electrode and a second electrode differing in polarity from the first electrode, wherein the second electrode is formed at a corner position on the compound semiconductor layer exposed to a side opposite the first electrode and the transparent substrate has a side face comprising a first side face roughly perpendicular to the light-emitting surface of the light-emitting layer on a side approximating to the light-emitting layer and a second side face inclined to the light-emitting surface on a side distant from the light-emitting layer.

The seventh aspect of this invention includes the configuration of the third or fourth aspect, wherein the angle of inclination of the second side face is 10 degrees or more and 30 degrees or less.

The eighth aspect of this invention includes the configuration of the third or fourth aspect, wherein the angle of inclination of the second side face is 10 degrees or more and 20 degrees or less.

The ninth aspect of this invention includes the configuration of the fifth or sixth aspect, wherein the second side face and a surface parallel to the light-emitting surface form therebetween an angle in a range of 55 degrees~80 degrees.

The tenth aspect of this invention includes the configuration of the third or fourth aspect, wherein the first side face has a length of 50 μm or more and 100 μm or less and the second side face has a length of 100 μm or more and 250 μm or less.

The eleventh aspect of this invention includes the configuration of the fifth or sixth aspect, wherein the first side face has a length in a range of 30 μm~100 μm.

The twelfth aspect of this invention includes the configuration of the first, fifth or sixth aspect, wherein the transparent substrate is made of gallium phosphide (GaP).

The thirteenth aspect of this invention includes the configuration of the fifth or sixth aspect, wherein the transparent substrate is an n-type GaP single crystal in substance and has a surface orientation of (100) or (111).

The fourteenth aspect of this invention includes the configuration of the fifth or sixth aspect mentioned above, wherein the transparent substrate has a thickness in a range of 50 μm ~300 μm.

The fifteenth aspect of this invention includes the configuration of the fifth or sixth aspect, wherein the transparent substrate is made of silicon carbide (SiC).

The sixteenth aspect of this invention includes the configuration of the first aspect, wherein the transparent substrate has a back surface that is a coarsened surface capable of scattering light.

The seventeenth aspect of this invention includes the configuration of the first aspect, wherein the transparent substrate has a back surface having a metal film formed thereon.

The eighteenth aspect of this invention includes the configuration of the seventeenth aspect, wherein the metal film on the back surface of the transparent substrate contains a metal having a melting point of 400° C. or less.

The nineteenth aspect of this invention includes the configuration of the seventeenth aspect, wherein the metal film is made of an AuSn alloy.

The twentieth aspect of this invention includes the configuration of the first aspect, wherein the light-emitting diode is used with an electric power of 1.5 W or more and the area of the back surface thereof is 0.6 mm$^2$ or more.

The twenty-first aspect of this invention includes the configuration of the sixteenth aspect, wherein the transparent substrate is a GaP substrate and the back surface thereof results from treatment of the GaP substrate with hydrochloric acid.

The twenty-second aspect of this invention includes the configuration of the third aspect, wherein the first and second side faces of the transparent substrate are those formed by the dicing method.

The twenty-third aspect of this invention includes the configuration of the fifth aspect, wherein the second electrode has a periphery thereof encircled with a semiconductor layer.

The twenty-fourth aspect of this invention includes the configuration of the sixth aspect, wherein the second electrode is positioned above an inclined structure of the second side face.

The twenty-fifth aspect of this invention includes the configuration of the fifth aspect, wherein the first electrode has a shape of a lattice.

The twenty-sixth aspect of this invention includes the configuration of the fifth or sixth aspect, wherein the first electrode comprises a pad electrode and a linear electrode having a width of 10 μm or less.

The twenty-seventh aspect of this invention includes the configuration of the fifth or sixth aspect, wherein the light-emitting part contains a GaP layer and the second electrode is formed on the GaP layer.

The twenty-eighth aspect of this invention includes the configuration of the fifth or sixth aspect, wherein the first electrode possesses an n-type polarity and the second electrode possesses a p-type polarity.

The twenty-ninth aspect of this invention includes the configuration of the fifth or sixth aspect, wherein the inclined second face of the transparent substrate has coarseness.

The thirtieth aspect of this invention consists in a method for the fabrication of a light-emitting diode, comprising the steps of forming a light-emitting part containing a light-emitting layer having a composition of formula $(Al_XGa_{1-X})_YIn_{1-Y}P$; in which $0 \leq X \leq 1$ and $0 < Y \leq 1$, subsequently causing a compound semiconductor layer containing the light-emitting part to be joined to a transparent substrate, causing a first electrode attached to a main light-emitting surface on a side opposite the transparent substrate and a second electrode differing in polarity from the first electrode to be formed on an exposed part of the compound semiconductor layer in such a manner that the second electrode may be disposed on a side opposite the first electrode, and allowing side faces of the transparent substrate to form a first side face roughly perpendicular to the light-emitting surface of the light-emitting layer on a side approximating to the light-emitting layer and a second side face inclined to the light-emitting surface on a side distant from the light-emitting layer by a dicing method.

The thirty-first aspect of this invention consists in a method for the fabrication of a light-emitting diode, comprising the steps of forming a light-emitting part containing a light-emitting layer having a composition of formula $(Al_XGa_{1-X})_YIn_{1-Y}P$; in which $0 \leq X \leq 1$ and $0 < Y \leq 1$, subsequently causing a compound semiconductor layer containing the light-emitting part to be joined to a transparent substrate, causing a first electrode attached to a main light-emitting surface on a side opposite the transparent substrate and a second electrode differing in polarity from the first electrode to be formed at a corner position on an exposed part of the semiconductor layer in such a manner that the second electrode may be disposed on a side opposite the first electrode, and allowing side faces of the transparent substrate to form a first side face roughly perpendicular to the light-emitting surface of the light-emitting layer on a side approximating to the light-emitting layer and a second side face inclined to the light-emitting surface on a side distant from the light-emitting layer by a dicing method.

The thirty-second aspect of this invention includes the configuration of the thirtieth or thirty-first aspect, wherein the first side face is formed by a scribe and break method.

The thirty-third aspect of this invention includes the configuration of the thirtieth or thirty-first aspect, wherein the first side face is formed by a dicing method.

According to this invention described above, since a transparent-substrate light-emitting diode possessing a light-emitting layer made of a compound semiconductor has the relation of the area of the light-emitting layer and the area of the back surface of the transparent substrate and the condition of the side face of the transparent substrate optimized, it is made possible to provide a light-emitting diode that possesses such high brightness as has never been attained heretofore, exhibits a high exoergic property and suits use of a high degree of electric current.

Further, according to this invention, the transparent-substrate light-emitting diode possessing a light-emitting layer made of a compound semiconductor is enabled to have the disposition of electrodes and the shape of chips optimized.

This invention, therefore, is capable of providing a light-emitting diode that has the efficiency of extracting light from the light-emitting part enhanced to a level not attainable heretofore, exhibits high brightness, suppresses the operation voltage and possesses high reliability.

The above and other objects, characteristic features and advantages of the present invention will become apparent to those skilled in the art from the description to be given herein below with reference to the accompanying drawings.

BEST MODE FOR CARRYING OUT THE INVENTION

Figure 1:
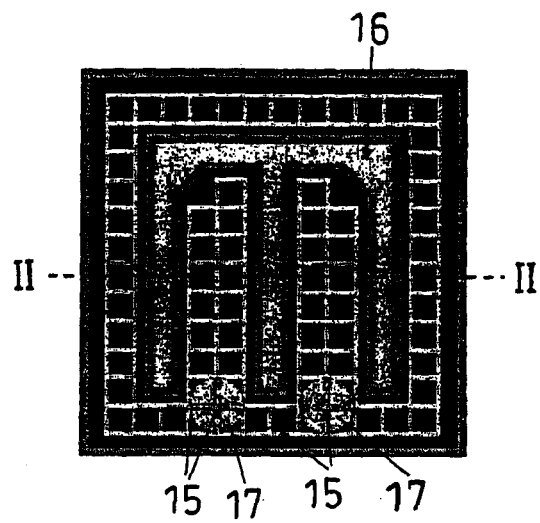
FIG. 1 is a schematic plan view of a semiconductor light-emitting diode 10 of Example 1.

The light-emitting diode of this invention possesses a light-emitting layer made of a compound semiconductor. Though known light-emitting layers, such as GaAlAs-based, InGaN-based and AlInGaP-based light-emitting layers, are available as the light-emitting layer mentioned above, particularly InGaN-based and AlInGaP-based light-emitting layers that have a thin epitaxial layer are easy to fabricate. These light-emitting parts are effective for wavelengths in a broad range extended from the ultraviolet to the infrared wavebands.

The light-emitting diode of this invention prefers to comprise a light-emitting part resulting from stacking a clad layer, a contact layer and the like besides the light-emitting layer.

The light-emitting part contemplated by this invention prefers to consist of a compound semiconductor stacked structure containing a light-emitting layer made of $(Al_XGa_{1-X})_YIn_{1-Y}P$; ($0 \leq X \leq 1$, $0 < Y \leq 1$). In this case, the light-emitting layer can be formed of $(Al_XGa_{1-X})_YIn_{1-Y}P$; ($0 \leq X \leq 1$, $0 < Y \leq 1$) of either of the conduction types, n-type and p-type. Though the light-emitting layer may be in either of the structures, i.e. a Single Quantum Well (SQW) structure and a Multi-Quantum Well (MQW) structure, it prefers to have the MQW structure for the purpose of obtaining light emission excelling in monochromaticity. The composition of $(Al_XGa_{1-X})_YIn_{1-Y}P$; ($0 \leq X \leq 1$, $0 < Y \leq 1$) of which a barrier layer and a well layer possessing a Quantum Well (QW) structure are formed is so decided that the quantum level fated to form an expected light-emitting wavelength may be formed within the well layer.

Most advantageously for the sake of securing light emission of high intensity, the light-emitting part prefers to have the so-called Double Hetero (DH) structure that comprises the light-emitting layer and clad layers disposed as opposed to each other at the opposite sides of the light-emitting layer for the purpose of "entrapping" in the light-emitting layer the carrier and the light emission destined to bring about radiation recombination. The clad layer prefers to be formed of a semiconductor material possessing a wider forbidden band and a higher refractive index rather than the composition of $(Al_XGa_{1-X})_YIn_{1-Y}P$; ($0 \leq X \leq 1$, $0 < Y \leq 1$) of which the light-emitting layer is formed. As regards the light-emitting layer formed of $Al_{0.4}Ga_{0.6})_{0.5}In_{0.5}P$ and enabled to emit a yellowish green color having a wavelength of about 570 nm, for example, the clad layer is formed of $(Al_{0.7}Ga_{0.3})_{0.5}In_{0.5}P$ (Y. Hosokawa et al., J. Crystal Growth, 221 (2000), 652-656). It is permissible to interpose between the light-emitting layer and the clad layer an intermediate layer adapted to change moderately the discontinuity of band between the two layers. In this case, the intermediate layer prefers to be formed of a semiconductor material possessing a forbidden band width intermediate between the light-emitting layer and the clad layer.

As means to form the component layers of the light-emitting part, the MetalOrganic Chemical Vapor Deposition (MOCVD) means, the Molecular Beam Epitaxial (MBE) means and the Liquid Phase Epitaxial (LPE) means may be cited.

The light-emitting diode of this invention is a so-called transparent-substrate light-emitting diode that is provided on the side opposite a light-extracting surface with a transparent substrate. This invention, therefore, needs to join a transparent substrate to a light-emitting part furnished with a light-emitting layer. The transparent substrate is formed of a material possessing strength sufficient for mechanically supporting the light-emitting part, imparting a large width to the forbidden band capable of transmitting the light emitted from the light-emitting part, and exhibiting transparency to the optical wavelength. For example, it may be formed of a Group III-V compound semiconductor crystal, such as gallium phosphide (GaP), aluminum-gallium arsenide (AlGaAs) or gallium nitride (GaN), a Group II-VI compound semiconductor crystal, such as zinc sulfide (ZnS) or zinc selenide (ZnSe), a Group IV semiconductor crystal, such as hexagonal or cubic silicon carbide (SiC), or zinc oxide, sapphire or alumina. Particularly, GaP and SiC are usable preferably among other materials cited above. GaP is mass-produced in the form of a single crystal and excels in workability. The thermal conductivity of GaP is 110 W/m·K. Though GaP is allowed to adopt as its principal plane for the purpose of processing any of ordinary surface orientations, such as (111) face and (100) face, it prefers to use as the principal plane the (111) face that is easily coarsened. SiC, in spite of weakness in incurring difficulty of processing, is mass-produced in the form of a single crystal and exhibits thermal conductivity of 167 W/m·K and, therefore, proves to be the most suitable material in terms of radiation of heat.

The transparent substrate prefers to have an approximate thickness of 50 µm or more in order to support the light-emitting part with mechanically sufficient strength. It further prefers to keep the thickness from exceeding about 300 µm in order that the transparent substrate subsequent to joining may undergo mechanical processing easily. In the compound semiconductor LED furnished with the light-emitting layer made of $(Al_XGa_{1-X})_YIn_{1-Y}P$ ($0 \leq X \leq 1$, $0 < Y \leq 1$), it is most appropriate to form the transparent substrate of n-type GaP single crystal having a thickness of 50 µm or more and about 300 µm or less.

In the case of joining a transparent substrate made of gallium phosphide (GaP) to the uppermost surface layer of a light-emitting part, for example, the choice of forming the uppermost surface layer of the light-emitting part with a Group III-V compound semiconductor material that differs in lattice constant from the other Group III-V compound semiconductor component layers of the light-emitting part enables manifestation of the function of allaying the stress exerted on the light-emitting part while the transparent substrate is joined thereto. The use of this material results in preventing the light-emitting layer from sustaining damage during the course of joining and contributing, for example, to stable provision of a compound semiconductor LED capable of emitting light of an expected wavelength. The uppermost surface layer of the light-emitting part prefers to have a thickness of 0.5 µm or more for the purpose of sufficiently allaying the stress exerted on the light-emitting part while the transparent substrate is joined thereto. If the uppermost surface layer is given an unduly large thickness, the excess will result in inevitably exerting stress on the light-emitting layer during the course of forming the uppermost surface layer because of the difference in lattice constant from the other component layers of the light-emitting part For the sake of avoiding this mishap, it is proper to give the uppermost surface layer a thickness of 20 µm or less.

Particularly, when gallium phosphide (GaP) is selected for a transparent substrate that is convenient for the purpose of transmitting to the exterior the light emitted from a light-emitting layer made of $(Al_XGa_{1-X})_YIn_{1-Y}P$ ($0 \leq X \leq 1$, $0 < Y \leq 1$), the manufacture of the uppermost layer of the light-emitting part with a semiconductor material containing gallium (Ga) and phosphorus (P) as component elements and containing Ga more than P enables formation of strong joining. It is particularly appropriate to form the uppermost layer of $Ga_XP_{1-X}$ ($0.5 < X < 0.7$), a nonstoichiometric composition.

The surface of the transparent substrate about to be joined and the surface of the uppermost layer of the light-emitting part are surfaces formed of single crystal and these surfaces prefer to have an identical surface orientation. The surfaces both prefer to have a (100) face or a (111) face invariably. For the purpose of obtaining an uppermost layer of a light-emitting part having a (100) face or a (111) face for the surface thereof, it suffices to use a substrate having a (100) face or a (111) face for the surface thereof in forming the uppermost layer of the light-emitting part on a substrate. When a gallium arsenide (GaAs) single crystal having a (100) face as the surface thereof is used as a substrate, for example, an uppermost layer of a light-emitting part having a (100) face as the surface thereof can be formed.

Particularly strong joining is accomplished when the surface of the transparent substrate or the uppermost layer of the light-emitting part to which the substrate is joined is so flat as to be expressed by a root-mean-square value (rms) of 0.3 nm or less. The surface of this flatness can be obtained, for example, by the Chemical Mechanical Polishing (CMP) means that uses an abrasive agent containing a silicon carbide (SiC)-based fine powder or a cerium (Ce) fine powder. When the surface resulting from the chemical mechanical polishing is further treated with an acid solution or an alkali solution, this treatment enables further enhancement of the flatness of surface and contributes to the acquisition of a clean surface in consequence of the removal of foreign matter and contaminant suffered to adhere to the surface during the course of polishing.

The uppermost layer of the transparent substrate or the light-emitting part is subjected to the joining in a vacuum of $1 \times 10^{-2}$ Pa or less and more preferably $1 \times 10^{-3}$ Pa or less. Particularly by mutually joining the polished flat surfaces as described above, it is made possible to form strong joining. In joining these two surfaces mutually, it is necessary that the surfaces about to be joined be activated by irradiation with an atomic beam or an ion beam possessing energy of 50 eV or more. The term "activation" refers to the creation of a surface in a clean state resulting from removing an impurity layer and a contaminated layer containing oxide film and carbon and existing on the surfaces being joined. When this irradiation is performed on the surface of either of the transparent substrate or the component layer of the light-emitting part, the two surfaces are joined strongly and infallibly. When the irradiation is performed on both the surfaces, they can be joined with greater strength.

As an irradiation species that proves effective in bringing about strong joining, the beam of hydrogen (H) atom, hydrogen molecule ($H_2$) or hydrogen ion (proton: $H_+$) may be cited. By using for the irradiation a beam containing an element existing in the surface region about to be joined, it is made possible to obtain the joining that excels in strength. When gallium phosphide (GaP) having added zinc (Zn) is used for a transparent substrate, for example, the joining can be formed strongly by irradiating the surfaces about to be joined with an atomic or ion beam containing gallium (Ga), phosphorus (P) or zinc (Zn). When the surface of the transparent substrate or the uppermost layer of the light-emitting layer has high electric resistance, the irradiation of the surface with a beam that mainly contains ions possibly results in electrifying the surface. Since the joining cannot be formed strongly when this electrification of the surface induces an electric repulsion, the activation of the surface by the irradiation with an ion beam is preferably utilized for activating the surface that excels in electrical conductivity.

In the surface region of a transparent substrate or a component layer of a light-emitting part, the use of a beam of an inert gas, such as helium (He), neon (Ne), argon (Ar) or krypton (Kr) that is incapable of exerting a conspicuous change on the composition thereof results in fulfilling the activation of the surface stably. Particularly, the use of the beam of argon (Ar) atom (monoatomic molecule) proves to be beneficial in that it permits the surface to be expeditiously and conveniently activated. Helium (He) has a smaller atomic weight than argon (Ar) and, therefore, the He beam is at a disadvantage in entailing waste of time during the activation of the surface about to be joined. Meantime, the use of the beam of krypton (Kr) having a larger atomic weight than argon is at a disadvantage in possibly inflicting damage of impact on the surface.

On the occasion of joining the surface of the transparent substrate and the surface of the uppermost layer of the light-emitting part while the surfaces are overlapped in an opposed state, an effort to make the mechanical pressure over the entire joining surfaces proves to be favorable for strongly joining them. To be specific, the pressure falling in the range from 5 $g \cdot cm^{-2}$ to 100 $g \cdot cm^{-2}$ is exerted on the joining surfaces in the direction perpendicular thereto (vertically). Even when either or both of the transparent substrate and the uppermost layer of the light-emitting part are warped, this method succeeds in eliminating the warp and effecting the joining with uniform strength.

The transparent substrate and the light-emitting part are joined in vacuum of the preferred degree of vacuum mentioned above while either or both of the surfaces of the transparent substrate and the uppermost layer of the light-emitting part are kept below 100° C. and preferably below 50° C. and more preferably at room temperature. If they are joined in a high-temperature environment exceeding about 500° C., the excess of temperature will be at a disadvantage in thermally denaturalizing the light-emitting layer formed of $(Al_xGa_{1-x})_Y In_{1-Y}P$ ($0 \leq X \leq 1$, $0 < Y \leq 1$) and incorporated in the light-emitting part and consequently disrupting stable fabrication of a compound semiconductor LED capable of emitting light of an expected wavelength.

This invention joins a transparent substrate to the uppermost layer of a light-emitting part so as to set the light-emitting part in a mechanically supportable state and subsequently removes the substrate utilized for forming the light-emitting part so as to enhance the efficiency of extracting the emitted light to the exterior and consequently completes configuration of a compound semiconductor LED of high brightness. Particularly when an optically impervious material inevitably absorbing the light emitted from the light-emitting layer of $(Al_xGa_{1-x})_Y In_{1-Y}P$ ($0 \leq X \leq 1$, $0 < Y \leq 1$) is utilized as a substrate, the means to remove the substrate in the manner described above can contribute to stable fabrication of an LED of high brightness. When a layer such as, for example, a buffer layer that is made of a material absorbing the light emitted from the light-emitting layer intervenes between the substrate and the light-emitting part, the removal of the intervening layer in combination with the substrate proves to be favorable for imparting high brightness to the LED. The substrate can be removed by mechanical cutting, grinding, or physical dry or chemical wet etching or by combining these operations. Particularly by the selective etching means that utilizes differences in etching speed among materials of varying quality, it is made possible to achieve selective removal of the substrate alone and enable the removal of the substrate with satisfactory reproducibility and uniformly as well.

This invention is characterized by having a first electrode (of n-type, for example) and a second electrode (of a p-type, for example) both formed on a main light-extracting surface of a light-emitting diode. The term "main light-extracting surface" as used herein refers to the surface placed opposite a surface on which a transparent substrate is mounted in a light-emitting part. The reason for this invention configuring the electrodes in this way resides in the impartation of high brightness. By adopting this configuration, it is made possible to obviate the necessity of feeding an electric current to the transparent substrate being mounted. Consequently, the impartation of high brightness can be accomplished because a substrate abounding in transmittance can be mounted.

A light-emitting diode according to the first embodiment of this invention and a method for the fabrication thereof will be described in detail below by reference to FIG. 1 through FIG. 5.

Figure 2:
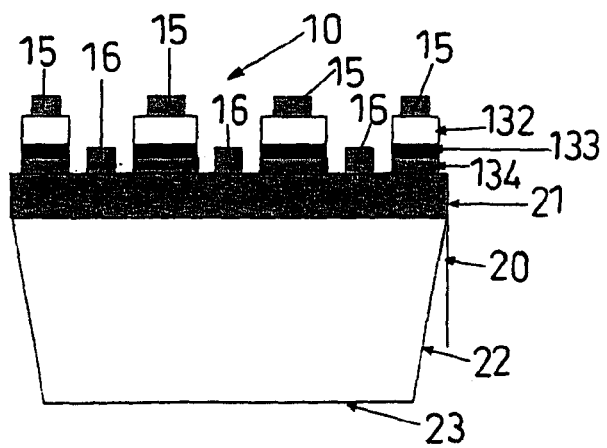
FIG. 2 is a schematic cross section taken through FIG. 1 along line II-II.

As regards electrodes, a first electrode and a second electrode differing in polarity therefrom are formed on a light-extracting surface as illustrated in FIG. 2. Both these electrodes possess a structure able to receive the work of wire bonding. The second electrode is formed by having part of a stacked body etched from the surface thereof to below a light-emitting layer and connected to a semiconductor layer or an electrically conductive transparent substrate.

Figure 4:
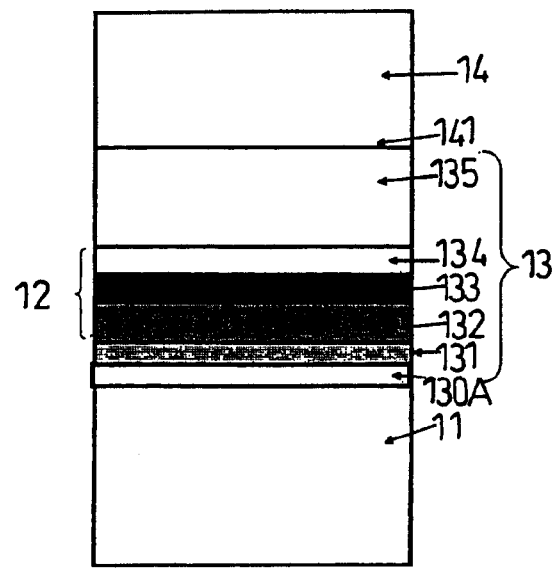
FIG. 4 is a schematic cross section illustrating a structure having a substrate joined to the semiconductor epitaxial stacked structure of FIG. 3.

This transparent substrate is joined on a semiconductor layer 135 as designated by a reference numeral 14 in FIG. 4.

The light-emitting diode according to the first embodiment is characterized in that the area (A) of a light-extracting surface, the area (B) of a light-emitting layer and the area (C) of the back surface of the light-emitting diode (the surface on the side opposite the electrode-forming side of a transparent substrate) are in a specific relation. The light-emitting diode generally has the periphery of the light-emitting region thereof covered with transparent resin. Since transparent resin, such as epoxy resin, has inferior thermal conduction, however, the light-emitting region of the light-emitting diode cannot be expected to allow radiation of heat. Most of the heat generated in the light-emitting diode, therefore, is radiated through the substrate of a package contiguous to the back surface of the light-emitting diode. The area (C) of the back surface serving as an exoergic surface, the area (B) of the light-emitting layer constituting a heat-generating surface, and the area (A) of the upper surface of the device functioning as a light-extracting surface have the optimum relation with brightness and heat radiation.

Though the relation of C>A>B proves to be favorable in sole consideration of the exoergic surface, the impartation of high brightness cannot be achieved when the light-extracting surface and the light-emitting layer have small areas. Further, the area of the expensive epitaxial layer to be removed is so increased as to boost the cost. To obtain high brightness, the area (B) of the light-emitting layer and area (A) of the light-extracting surface are made maximum, with the side face of the transparent substrate formed as an inclined face. The light-emitting layer is located near the light-extracting surface. The heat generated in the light-emitting layer is let loose by being diffused in the large area (A) of the light-extracting surface to expel the heat in the light-emitting layer, smoothly conducted along the interior of the structure of the light-emitting diode, and eventually radiated to the back surface serving as an exoergic surface.

Since it is necessary that the impartation of high brightness be promoted and the radiation of heat be enhanced as well by inclining the side faces of the transparent substrate, it is favorable to avoid disposing an inclined face on the side face of the transparent substrate near the light-emitting layer for the purpose of enlarging the area (A) of the light-extracting surface. For the purpose of enabling the heat to be easily diffused, the semiconductor near the light-emitting layer prefers to have as large a volume as permissible. Thus, the inclined face is formed on the side face of the transparent substrate near the back surface that is distant from the light-emitting layer. Since the inclined face near the back surface touches a material possessing an excellent exoergic property, the heat finds ample escape and allows no rate-determining degree of heat radiation even when the area (C) of the back surface of the light-emitting diode is slightly smaller than the area (A) of the light-extracting surface. The conditions that are favorable for maintaining the balance of areas are shown below.

$$0.95 \times A > C > 0.6 \times A$$

$$0.9 \times A > B > 0.7 \times A$$

$$C < B > 0.8 \times C$$

$$\therefore A > C > B$$

A light-emitting diode operating with an electric power of 0.5 W or more is required to possess a high exoergic property and a light-emitting diode of a large size used with a large electric power of 1.5 W or more is required to possess a still higher exoergic property. In the light-emitting diode that is used with such a large electric power as this, the back surface prefers to possess an area of 0.6 mm$^2$ or more. The exoergic effect to be manifested by the light-emitting diode gains in prominence in accordance as the size of this diode increases.

When the transparent substrate is formed of GaP, it prefers to have the back surface thereof treated with hydrochloric acid. Particularly, the method that utilizes the face of the surface orientation (111) for this treatment proves to be favorable.

Figure 5:
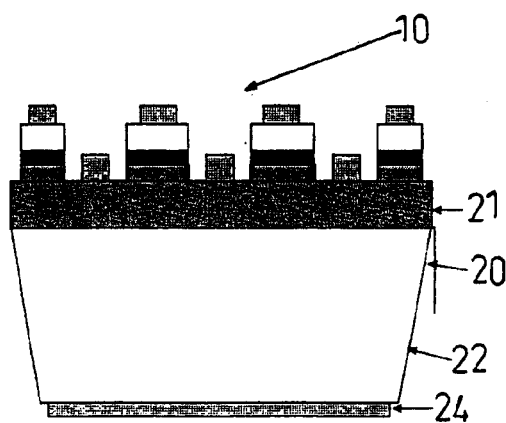
FIG. 5 is a schematic cross section of a semiconductor light-emitting diode 10 of Example 2.

The light-emitting diode according to the first embodiment is also characterized by the shape of the side face. That is, in the ordinary case, it is characterized by the fact that at least one of the side faces of the transparent substrate is inclined. The transparent substrate prefers to possess a first side face 21 and a second side face 22 as illustrated in FIG. 2 and FIG. 5. Then, the angle of inclination of the first side face 21 is smaller than the angle of inclination of the second side face 22. In this case, the first side face 21 prefers to have no (zero) angle of inclination, i.e. to be perpendicular to the transparent substrate. The angle of inclination of the second side face 22, in FIG. 2 and FIG. 5, is indicated by an inclined angle 20 relative to the perpendiculars of the transparent substrate. The angle of inclination of the second side face 22 is preferably in the range of 10 degrees or more and 30 degrees or less and more preferably in the range of 10 degrees or more and 20 degrees or less. The second side face 22 may be an inclined face having a fixed angle of inclination, an inclined face formed in a polygonal shape with a plurality of angles of inclination or an inclined curved face. When the second side face 22 is formed of a plurality of angles of inclination, the angle of the second side face 22 is expressed by the arithmetic mean of all the angles of inclination. In the case of a curved face, the angle of the second side face 22 is expressed by the angle with a line connecting the starting point and the end point of the curved face.

The angle of the side face of the transparent substrate has brightness and an exoergic property taken into consideration. The light-emitting diode of the first embodiment wherein the side face of the transparent substrate is shaped as described above particularly excels in the properties manifested in the region of high electric current Though the largeness of the angle of the side face of the transparent substrate is advantageous in terms of the extraction of light, the angle in the range mentioned above is most favorable because the addition to this angle tends to heighten thermal resistance on account of the proportionate decrease in the area (C) of the back surface of the light-emitting diode. Incidentally, the idea of enhancing the efficiency of light extraction by inclining the side face of the light-emitting diode has been known to the public as described in the documents mentioned earlier.

In the light-emitting diode of the first embodiment, by causing the transparent substrate to be so formed as to have the first side face 21 and the second side face 22 as described above and further causing the first side face 21 to acquire a smaller angle of inclination than the second side face 22, it is made possible to bring about the effect of enlarging the area near the light-emitting layer and promoting the radiation of heat and allowing the second side face 22 to heighten brightness.

Concerning the lengths of the side faces, the length (L) of the first side face 21 prefers to be 50 μm or more and 100 μm or less and the length (M) of the second side face 22 prefers to be 100 μm or more and 250 μm or less. And the ratio M/L prefers to be in the range from 1 to 5.

The first side face 21 and the second side face 22 of the transparent substrate of the light-emitting diode can be formed by the dicing method. Alternatively, the side faces of the transparent substrate may be formed by using methods, such as wet etching, dry etching, scribing and laser processing, in combination. Nevertheless, the dicing method that excels in the shape controlling property and the productivity proves to be most suitable.

A back face 23 of the transparent substrate of the light-emitting diode may be formed into a coarsened surface capable of scattering light The back face 23 of the light-emitting diode is a surface that is connected to a package resulting form assembling. The connecting face is generally cemented on the package by using an Ag paste having high reflectance or fixed on a metal, such as silver or aluminum, having high reflectance with a transparent adhesive agent with a view to heightening the brightness of the light-emitting diode. The back face 23 that is formed of a coarsened surface capable of scattering light contributes to the enhancement of brightness because the light not easily extracted from the side face or the upper face can be scattered at angles of reflection capable of extracting light. Further, since the back face 23 formed of a coarsened surface capable of scattering light acquires addition to the surface area, it also manifests the effect of an exoergic surface claimed to facilitate the escape of heat toward the package side.

In addition to the configuration mentioned above, the back face 23 of the transparent substrate of the light-emitting diode allows a metallic film to be formed thereon. The metallic film is capable of imparting a function of reflecting light and a function of heightening thermal conduction to the light-emitting diode side and widening the range of selection of packaging material as well. The metallic film prefers to contain a metal having a melting point not exceeding 400° C. As a means to connect the transparent substrate of the light-emitting diode to the package, the soldering or the technique using eutectic bonding can be adopted. This method is most suitable in terms of the exoergic property because the light-emitting diode and the package can be connected via a metal by using this method. Then, by adding a metal for the sake of connection to the back face 23 of the light-emitting diode, the assemblage of the light-emitting diode lamp can be facilitated. In consideration of the material generally used for the package, the conditions for effecting the connection at a temperature not exceeding 400° C. prove to be favorable.

For the metallic film, the use of an AuSn alloy proves to be favorable. The AuSn alloy is used as a eutectic metal and, because the AuSn alloy having an Sn content of 20 wt % at the eutectic point has a melting point of about 283° C., proves to be the most suitable material that allows connection at a low temperature.

As a method for producing the light-emitting diode besides the method described above, any of the known techniques available for the fabrication of light-emitting diodes may be utilized. Through the process consisting of such steps as formation of an ohmic electrode, separation, and inspection and evaluation, the light-emitting diode is fabricated. Further, by having the light-emitting diode incorporated in the package, such lighting fixture as a lamp can be manufactured.

The light-emitting diode according to the second embodiment of this invention is characterized in that a transparent substrate has a first side face nearly perpendicular to the light-emitting surface of a light-emitting layer at a portion on the side near the light-emitting layer and a second side face inclined relative to the light-emitting surface at a portion on the side distant from the light-emitting layer.

The light-emitting diode of this invention prefers to have this configuration for the reason that the configuration enables the light radiated from the light-emitting layer toward the transparent substrate side to be extracted efficiently to the exterior. To be specific, part of the light radiated from the light-emitting layer toward the transparent substrate side can be reflected by the first side face and extracted from the second side face. The light reflected by the second side face can be extracted from the first side face. The synergistic effect of the first side face and the second side face results in enabling addition to the probability of light extraction.

Figure 11:
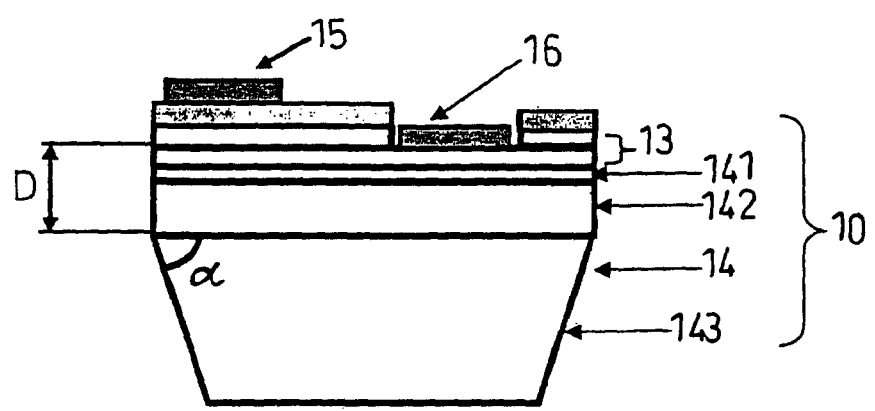
FIG. 11 is a schematic cross section taken through FIG. 10 along line XI-XI.

The light-emitting diode of the second embodiment prefers to limit the angle α formed by the second side face and the surface parallel to the light-emitting surface within the range of 55 degrees~80 degrees (refer to FIG. 11). By causing the angle to fall in this range, it is made possible to attain efficient extraction to the exterior of the light reflected on the bottom part of the transparent substrate.

The light-emitting diode of the second embodiment prefers to have the length D (in the direction of thickness) of the first side face fall in the range of 30 μm~100 μm. By limiting the length of the first side face in this range, it is made possible to heighten the efficiency of light emission of the light-emitting diode of this invention because the light reflected on the bottom part of the transparent substrate is efficiently returned to the light-emitting surface at the portion of the first side face and radiated through the main light-extracting surface.

In the configuration of the invention, the first electrode prefers to assume the shape of a lattice. By giving the first electrode this shape of a lattice, it is made possible to enhance the reliability of the light-emitting diode of this invention because the shape enables uniform injection of an electric current to the light-emitting layer.

Then, the light-emitting diode of the second embodiment allows the first electrode to be formed of a pad electrode and a linear electrode having a width not exceeding 10 μm. Owing to the configuration directed toward decreasing the width of the electrode as described above, it is made possible to attain impartation of high brightness to the light-emitting diode of this invention because the area of openings in the light-extracting surface can be consequently increased.

Further, by forming the first electrode in the shape of a lattice, it is made possible to enhance the reliability of the light-emitting diode of this invention because the lattice allows uniform injection of an electric current to the light-emitting layer.

The light-emitting diode of the second embodiment prefers to have the periphery of the second electrode enclosed with a semiconductor layer. By adopting the configuration directed toward surrounding the four sides of the second electrode with the first electrode as described above, it is made possible to lower the operating voltage because the electric current is allowed to flow easily in four directions.

The light-emitting diode of the second embodiment allows the light-emitting part to have a structure incorporating a GaP layer and permits the second electrode to be formed on the GaP layer. The adoption of this configuration enables manifestation of an effect of lowering the operating voltage. By having the second electrode formed on the GaP layer, it is made possible to enable production of an ideal ohmic contact and lower the operating voltage consequently.

The light-emitting diode of the second embodiment prefers to give the first electrode n-type polarity and the second electrode p-type polarity. The adoption of this configuration brings about an effect of enhancing brightness. The formation of the first electrode in the p-type polarity results in deteriorating the diffusion of the electric current and degrading the brightness. Nevertheless, the formation of the first electrode in the n-type polarity results in enhancing the diffusion of the electric current and realizing impartation of high brightness to the light-emitting diode.

The light-emitting diode of the second embodiment prefers to have the inclined face of the transparent substrate formed into a coarsened surface. The impartation of the coarsened surface to the inclined face results in suppressing the total reflection on the inclined face and enhancing the efficiency of light extraction. The coarsened surface can be obtained, for example, by a chemical etching with phosphoric acid+hydrochloric acid.

Then, the light-emitting diode of the second embodiment, besides the configuration mentioned above and similarly to the light-emitting diode of the first embodiment, allows a metallic film to be formed on the back face 23 of the transparent substrate of the light-emitting diode.

The light-emitting diode of the second embodiment can be produced utilizing the method available for the production of the light-emitting diode of the first embodiment.

In this invention, the first side face prefers to be formed by the scribe and break method or the dicing method. By adopting the former method of production, it is made possible to lower the cost of production. Specifically, this method of production permits production of numerous light-emitting diodes and allows reduction of the cost of production because it obviates the necessity of leaving cutting allowance behind during the separation of chips. The latter method brings about an effect of heightening brightness. By adopting this method of production, it is made possible to add to the efficiency of light extraction through the first side face and achieve impartation of increased brightness.

By the same token, the second side face prefers to be formed by the dicing method. By adopting this method of production, it is made possible to bring about an effect of augmenting the yield of production. The first side face and the second side face can be formed using methods, such as wet etching, dry etching, scribing and laser processing in combination. Nevertheless, the dicing method that excels in the shape controlling property and the productivity proves to be most suitable.

As a method for producing the light-emitting diode besides the method described above, any of the known techniques available for the production of light-emitting diodes may be utilized. Through the process consisting of such steps as formation of an ohmic electrode, separation, and inspection and evaluation, the light-emitting diode is produced. Further, by having the light-emitting diode incorporated in the package, such lighting fixture as a lamp can be manufactured.

The light-emitting diode according to the third embodiment of this invention possesses a configuration in common at large with the second embodiment of this invention and can be produced by making use of the method of production of the light-emitting diode of the second embodiment.

To be specific, the light-emitting diode of the third embodiment is configured by causing a transparent substrate to form a first side face nearly perpendicular to the light-emitting surface of a light-emitting layer at a portion on the side near the light-emitting layer and a second side face inclined relative to the light-emitting surface at a portion on the side distant from the light-emitting layer and causing the second side face to be inclined toward the inner side of a semiconductor layer.

The light-emitting diode of the third embodiment, in the configuration of the second embodiment described above, is further characterized by having the second electrode formed at the position of a corner on a compound semiconductor layer on the side opposite the first electrode. The expression "the position of a corner on a compound semiconductor layer" as used herein refers to the parts of the corners at four portions on the plane of a tetragonal compound semiconductor, for example. This invention allows the second electrode to be formed in at least one of the corners located at the four portions. By having the second electrode formed at the position mentioned above, it is made possible to enable impartation of heightened brightness to the light-emitting diode of this invention because part of the light radiated from the light-emitting layer to the light-extracting surface can be extracted through the side face of the compound semiconductor layer near the second electrode.

The second electrode can be formed at a position above the inclined structure of the second side face. By having the second electrode formed at this position, it is made possible to realize impartation of heightened brightness because the light-emitting diode of this invention is enabled to acquire addition to the efficiency of light extraction in the inclined face.

Now, the light-emitting diode embodying this invention will be described below by reference to the accompanying drawings. In the following explanation, the parts appearing in different drawings and fulfilling identical or equivalent functions will be denoted by like reference numerals and their descriptions will not be repeated.

Example 1 and Example 2 in the following description are examples more specifically illustrating the configuration of the light-emitting diode according to the first embodiment Example 3 and Example 4 more specifically illustrate the light-emitting diodes respectively according to the second embodiment and the third embodiment.

Example 1

Figure 3:
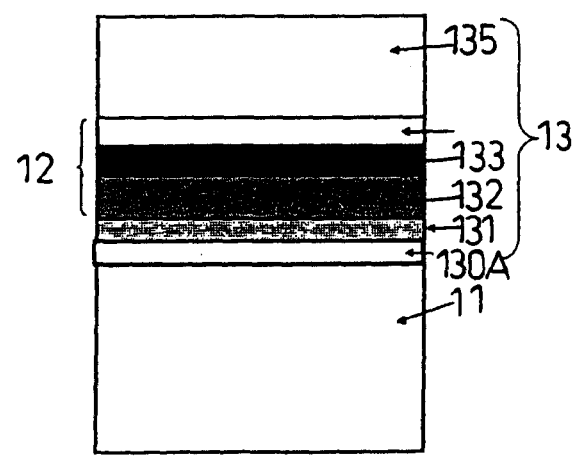
FIG. 3 is a schematic view illustrating a cross-sectional structure of a semiconductor epitaxial stacked structure in Example 1.

FIG. 1 and FIG. 2 schematically illustrate a semiconductor light-emitting diode 10 fabricated in Example 1. FIG. 1 is a plan view and FIG. 2 is a cross section taken across FIG. 1 along line II-II. FIG. 3 is a schematic cross section of the layered structure of a semiconductor epitaxial stacked structure to be used in the semiconductor light-emitting diode 10 of Example 1 and FIG. 4 is a schematic cross section illustrating a structure resulting from joining a substrate 14 to the semiconductor epitaxial stacked structure of FIG. 3.

The semiconductor light-emitting diode 10 fabricated in Example 1 was a red color Light-Emitting Diode (LED) possessing an AlGaInP light-emitting part 12. It was fabricated by joining an epitaxial stacked structure formed on a semiconductor substrate 11 made of GaAs and the GaP substrate 14.

The light-emitting diode 10 was fabricated by using an epitaxial wafer that was furnished with an epitaxial growth layer 13 composed of semiconductor layers sequentially stacked on the semiconductor substrate 11 formed of an Si-doped n-type GaAs single crystal possessing a face inclined by 15° from the (100) face. The epitaxial growth layer 13 was configured by sequentially stacking component semiconductor layers, i.e. an etching stop layer 130A formed of Si-doped n-type $(Al_{0.5}Ga_{0.5})_{0.5}In_{0.5}P$, a contact layer 131 formed of Si-doped n-type GaAs, a lower clad layer 132 formed of Si-doped n-type $(Al_{0.7}Ga_{0.3})_{0.5}In_{0.5}P$, a light-emitting layer 133 formed of 20 pairs of undoped $(Al_{0.2}Ga_{0.8})_{0.5}In_{0.5}P$ and $(Al_{0.7}Ga_{0.3})_{0.5}In_{0.5}P$, an upper clad layer 134 formed of Mg-doped p-type $(Al_{0.7}Ga_{0.3})_{0.5}In_{0.5}P$ and an Mg-doped p-type GaP layer 135.

In Example 1, the semiconductor layers 130A~135 were individually stacked on the semiconductor substrate 11 by the low-pressure MetalOrganic Chemical Vapor Deposition method (MOCVD method) using trimethyl aluminum $((CH_3)_3 Al)$, trimethyl gallium $((CH_3)_3Ga)$ and trimethyl indium $((CH_3)_3In)$ as the raw materials for Group III component elements to give birth to an epitaxial wafer. As the raw material for the doping with Mg, biscyclopentadiethyl magnesium $(bis-(C_5H_5)_2Mg)$ was used. As the raw material for the doping with Si, disilane $(Si_2H_6)$ was used. As the raw material for the Group V component element, phosphine $(PH_3)$ or arsine $(AsH_3)$ was used. The GaP layer 135 was grown at 750° C. and the component semiconductor layers 130A~134 forming the epitaxial growth layer 13 were grown at 730° C.

The etching stop layer 130A had a carrier concentration of about $2\times10^{18}$ cm$^{-3}$ and a layer thickness of about 0.2 µm. The contact layer 131 had a carrier concentration of about $2\times10^{18}$ cm$^{-3}$ and a layer thickness of about 0.2 µm. The n-type lower clad layer 132 had a carrier concentration of about $8\times10^{17}$ cm$^{-3}$ and a layer thickness of about 2 µm. The undoped light-emitting layer 133 had a layer thickness of 0.8 µm. The p-type upper clad layer 134 had a carrier concentration of about $2\times10^{17}$ cm$^{-3}$ and a layer thickness of about 1 µm. The GaP layer 135 had a carrier concentration of about $3\times10^{18}$ cm$^{-3}$ and a layer thickness of about 9 µm.

The p-type GaP layer 135 was mirror finished by subjecting a region thereof reaching a depth of about 1 µm from the surface to polishing. By the mirror finishing, the surface of the p-type GaP layer 135 was given roughness of 0.18 nm in the root-mean-square (rms) value.

Meantime, the n-type GaP substrate 14 to be applied to the mirror-finished surface of the p-type GaP layer 135 was prepared. To this GaP substrate 14 for the application, Si was added till the carrier concentration reached about $1\times10^{17}$ cm$^{-3}$. A single crystal having a surface orientation of (111) was used. The GaP substrate 14 for the application had a diameter of 50 mm and a thickness of 250 µm. This GaP substrate 14 was given a specular surface by polishing and finished with coarseness of 0.12 nm in the rms value prior to being joined to the p-type Gap layer 135.

The GaP substrate 14 and the epitaxial wafer were carried in an ordinary semiconductor material-applying device and the device was evacuated till a vacuum of $3\times10^{-5}$ Pa. Then, the surfaces of the GaP substrate 14 and the epitaxial wafer were deprived of adhering contaminant by being exposed to an accelerated Ar beam by way of treatment prior to being joined. Thereafter, they were joined in a vacuum at room temperature.

Next, from the epitaxial wafer so joined, the semiconductor substrate 11 was selectively removed with an ammonia-based etchant. Thereafter, the etching stop layer 130A was removed with hydrochloric acid.

An AuGeNi alloy was deposited till a thickness of 0.2 µm on the surface of the contact layer 131 by the vacuum evaporation method to form an n-type ohmic electrode on the surface of the contact layer 131. The n-type ohmic electrode was subjected to patterning by the use of an ordinary photolithographic means to form a first electrode 15. Thereafter, the part of the contact layer 131 other than the electrode-forming part was removed.

Next, the semiconductor layers 132~134 inclusive of the light-emitting layer 133 in the region for forming the p-electrode were selectively removed to expose the GaP layer 135. On the surface of the GaP layer 135, the metal materials for AuBe and Au were deposited by the vacuum evaporation method till AuBe reached a thickness of 0.2 µm and Au reached a thickness of 1 µm to form a p-type ohmic electrode. At that time, the light-emitting layer 133 had an area of 0.72 mm$^2$. By further subjecting the metal materials to a heat treatment at 450° C. for 10 minutes, thereby alloying them, the first electrode 15 as a low-resistance n-type ohmic electrode and a second electrode 16 as a p-type ohmic electrode were formed.

Thereafter, Au was deposited till a thickness of 1 µm by the vacuum evaporation method on the surfaces of the first electrode and the second electrode to form a bonding pad 17 on the ohmic electrodes. Further, the part excluding the bonding pad 17 was covered with a protective film formed of an SiO$_2$ film 0.3 µm in thickness.

From the back surface 23 of the GaP substrate 14, a V-shaped groove was inserted by the use of a dicing saw till the angle 20 of the inclined face reached 15 degrees and the length of the second side face 22 reached about 180 µm. Then, the back surface 23 of the GaP substrate 14 was subjected to a coarsening treatment with hydrochloric acid.

Next, cuts were inserted into the epitaxial wafer at intervals of 1 mm from the first surface side by the use of a dicing saw to manufacture chips. The first side face 12 was formed in a length of about 80 µm nearly perpendicularly to the light-emitting layer 133.

The broken layer and the contaminant caused by dicing were removed with a mixed liquid of sulfuric acid and hydrogen peroxide to fabricate the semiconductor light-emitting diode 10. The back surface 23 of the semiconductor light-emitting diode 10 had an area of 0.8 mm$^2$.

Figure 8:
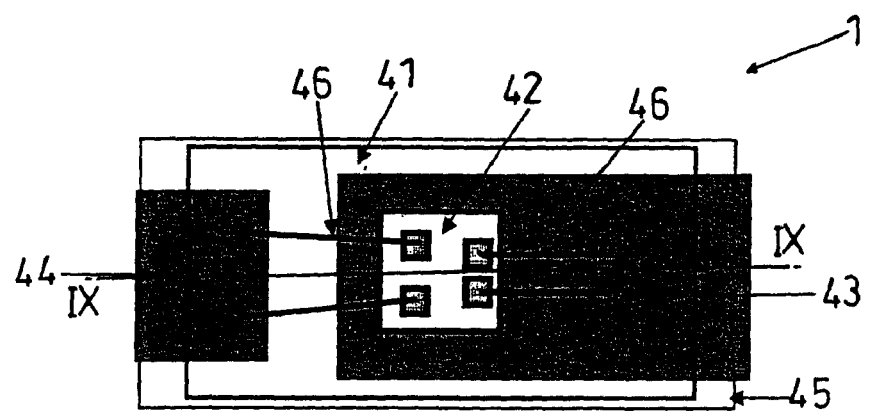
FIG. 8 is a schematic plan view of a semiconductor light-emitting diode lamp 1 using the semiconductor light-emitting diode 10 of Example 1 as a LED chip 42.
Figure 9:
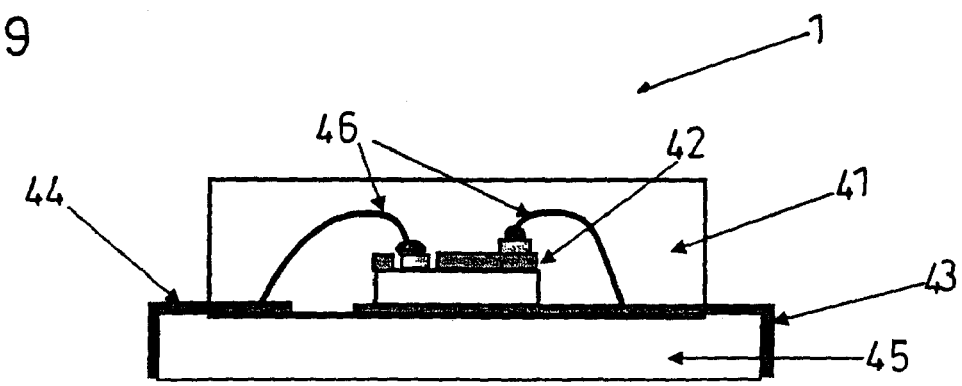
FIG. 9 is a schematic cross section of the semiconductor light-emitting diode lamp 1 taken through FIG. 8 along line IX-IX.

The semiconductor light-emitting diode 10 fabricated as described above was used as an LED chip 42 and a semiconductor Light-Emitting Diode lamp (LED lamp) 1 was assembled as illustrated schematically in FIG. 8 and FIG. 9. This LED lamp 1 was fabricated by fixing and mounting the LED chip 42 with silver paste on a mounting substrate 45, wire-bonding the n-type ohmic electrode 15 of the LED chip 42 to an n-electrode terminal 43 installed on the first surface of the mounting substrate 45 and the p-type ohmic electrode 16 to a p-electrode terminal 44 severally with a gold wire 46, and then sealing the joined parts with ordinary epoxy resin 41. Incidentally, aluminum nitride possessing a good exoergic property was used for the basic body of the mounting substrate 45.

When an electric current was made to pass between the n-type and p-type ohmic electrodes 15 and 16 via the n-electrode terminal 43 and the p-electrode terminal 44 installed on the first surface of the mounting substrate 45, the LED lamp 1 emitted a red color light having a main wavelength of 620 nm. The forward voltage (Vf) during the flow of an electric current of 500 mA in the forward direction reached about 2.4 V, a magnitude reflecting excellent ohmic properties of the ohmic electrodes 15 and 16. The intensity of the light emitted when the forward current was set at 500 mA was enabled to reach such high brightness of 5500 mcd by reflecting the fact that the structure of the light-emitting part of high efficiency of light emission and the removal of the broken layer taking place during the reduction of the epitaxial wafer into chips resulted in enhancing the efficiency of extraction of light to the exterior.

Example 2

A semiconductor light-emitting diode 10 of Example 2 possessing the same structure as in Example 1 while having a metal layer 24 of an AuSn eutectic (melting point 283° C.) formed on the back surface as illustrated in FIG. 5 was fabricated.

A semiconductor Light-Emitting Diode lamp (LED lamp) 1 possessing the structure illustrated schematically in FIG. 8 and FIG. 9 was assembled by following the same procedure as in the use of the semiconductor light-emitting diode 10 of Example 1 while using the semiconductor light-emitting diode 10 of Example 2 as an LED chip 42 and using AuSn in the place of the Ag paste.

The semiconductor light-emitting diode lamp 1 that was manufactured by using the semiconductor light-emitting diode 10 of Example 2 was evaluated in the same manner as in Example 1. The results are shown in Table 1 below. The forward voltage (Vf) during the flow of an electric current of 500 mA in the forward direction was 2.4 V. The intensity of light emission was enabled to reach a high brightness of 6430 mcd by reflecting the fact that the exoergic property was further enhanced and the absorption of light by the Ag paste was eliminated.

Comparative Example 1

Figure 6:
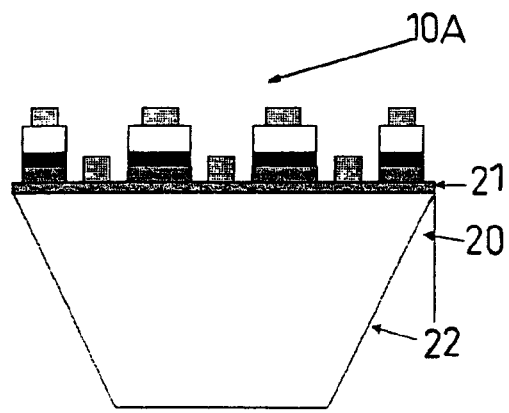
FIG. 6 is a schematic cross section of a semiconductor light-emitting diode A of Comparative Example 1.

A semiconductor light-emitting diode 10A of Comparative Example 2 illustrated in FIG. 6 was fabricated by following the procedure using a dicing saw similarly to Example 1 while changing the shape of the side face of the GaP substrate 14. The first side face was nearly perpendicular and had a length of 10 μm and the second side face had an angle of 30 degrees and a length of 300 μm. The back surface assumed an area of 0.5 mm². The light-emitting layer had an area of 0.72 mm² similarly to Example 1. A semiconductor Light-Emitting Diode lamp (LED lamp) possessing the structure illustrated schematically in FIG. 8 and FIG. 9 was assembled by following the same procedure as in the use of the semiconductor light-emitting diode 10 of Example 1 while using the semiconductor light-emitting diode 10A of Comparative Example 1 as the LED chip 42.

The semiconductor light-emitting diode lamp using the semiconductor light-emitting diode 10A of Comparative Example 1 was subjected to the same evaluation as in the case of Example 1. The results are shown in Table 1 below. The forward voltage (Vf) during the flow of an electric current of 500 mA in the forward direction was 2.4 V. The intensity of light emission of the semiconductor light-emitting diode lamp of Comparative Example 1 was only 3290 mcd in brightness because the semiconductor light-emitting diode 10A of Comparative Example 1 had a back surface of small area and revealed deficiency in heat radiation.

Comparative Example 2

Figure 7:
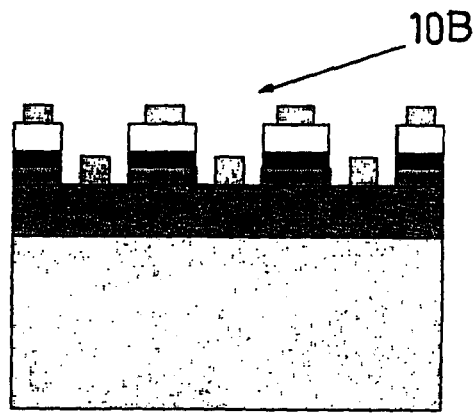
FIG. 7 is a schematic cross section of a semiconductor light-emitting diode B of Comparative Example 2.

A semiconductor light-emitting diode 10B of Comparative Example 2 devoid of an inclined face was fabricated (FIG. 7) by following the procedure using a dicing saw similarly to Example 1 while changing the shape of the side face of the GaP substrate 14. The back surface had an area of 0.9 mm². The light-emitting layer had an area of 0.72 mm² similarly to Example 1. A semiconductor Light-Emitting Diode lamp (LED lamp) possessing the structure illustrated schematically in FIG. 8 and FIG. 9 was assembled by following the same procedure as in the use of the semiconductor light-emitting diode 10 of Example 1 while using the semiconductor light-emitting diode 10B of Comparative Example 2 as the LED chip 42.

The semiconductor light-emitting diode lamp using the semiconductor light-emitting diode 10B of Comparative Example 2 was subjected to the same evaluation as in the case of Example 1. The results are shown in Table 1 below. The forward voltage (Vf) during the flow of an electric current of 500 mA in the forward direction was 2.4 V. The intensity of light emission was only 4270 mcd in brightness because the efficiency of light extraction was slightly low owing to the absence of an inclined face.

TABLE 1

| | First side face | | Second side face | | Area (mm²) | | Brightness (mcd) | | Forward Voltage (V) | |
|---|---|---|---|---|---|---|---|---|---|---|
| | Angle of inclination | Length (μm) | Angle of inclination | Length (μm) | Light-emitting layer | Back surface | IF = 100 mA | IF = 500 mA | IF = 100 mA | IF = 500 mA |
| Ex. 1 | 0 | 80 | 15 | 180 | 0.75 | 0.8 | 1150 | 5500 | 2 | 2.4 |
| Ex. 2 | 0 | 80 | 15 | 180 | 0.75 | 0.8 | 1280 | 6430 | 2 | 2.4 |
| Comp. Ex. 1 | 0 | 10 | 30 | 300 | 0.75 | 0.5 | 1190 | 3290 | 2 | 2.4 |
| Comp. Ex. 2 | 0 | 250 | 0 | — | 0.75 | 0.9 | 860 | 4270 | 2 | 2.4 |

Example 3

As another concrete example of the second embodiment, the light-emitting diode according to Example 3 will be described below by reference to the accompanying drawings.

Figure 10:
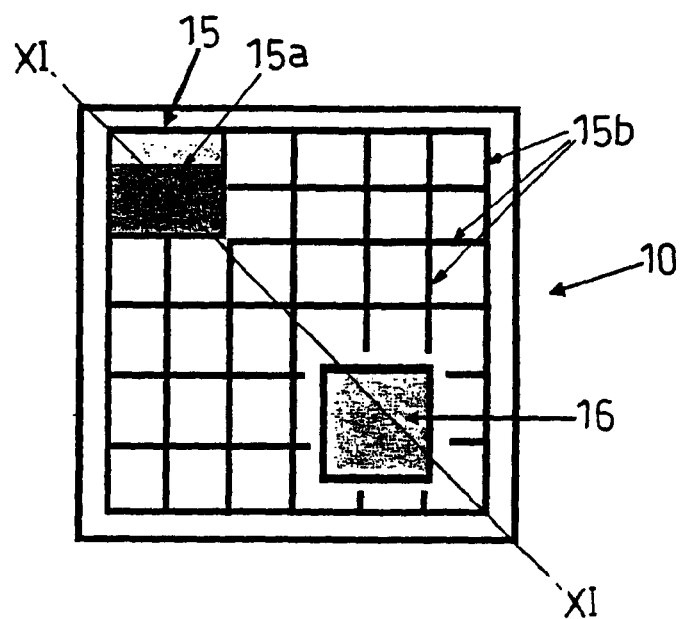
FIG. 10 is a schematic plan view of a semiconductor light-emitting diode 10 of Example 3.
Figure 12:
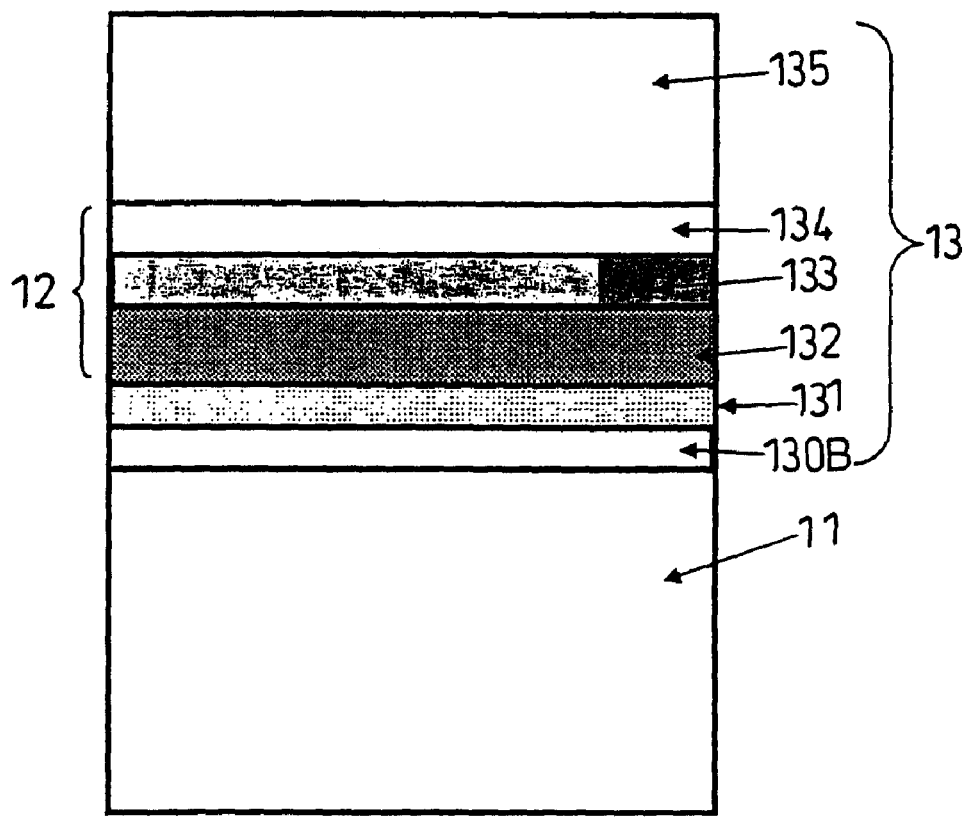
FIG. 12 is a schematic cross section of the layer structure of a semiconductor epitaxial stacked structure used in the semiconductor light-emitting diode 10 of Example 3.
Figure 13:
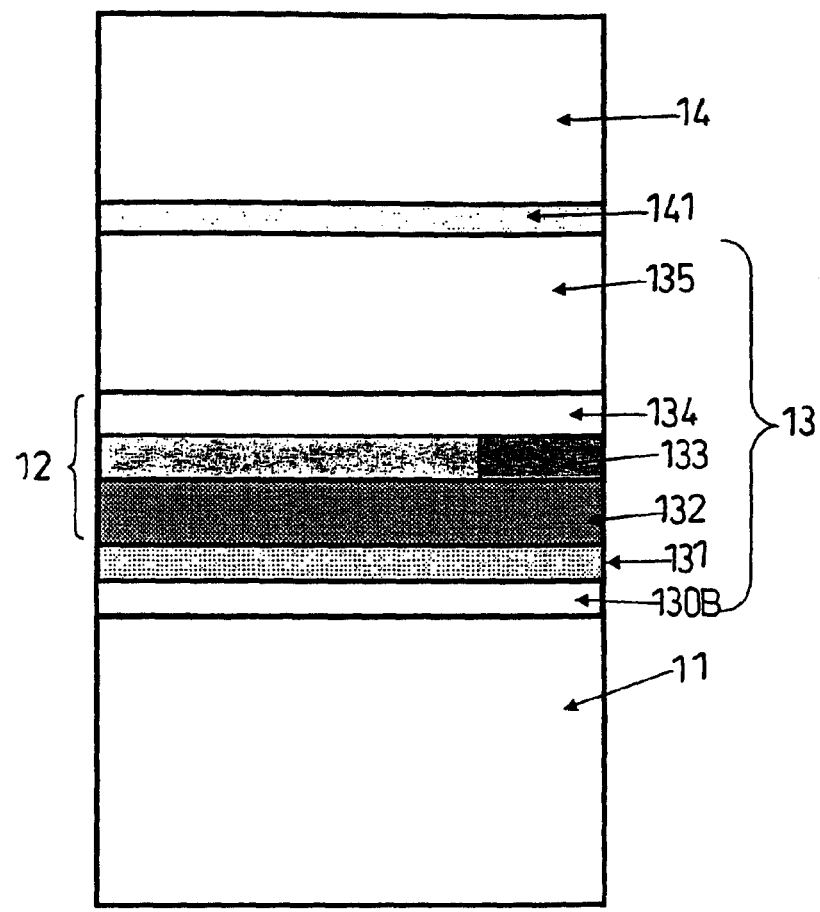
FIG. 13 is a schematic cross section illustrating a structure having a GaP substrate 14 joined to the semiconductor epitaxial stacked structure of FIG. 12.

FIG. 10 and FIG. 11 illustrate the semiconductor light-emitting diode 10 of Example 3; FIG. 10 is a plan view and FIG. 11 is a cross section taken across FIG. 10 along line XI-XI. FIG. 12 is a schematic cross section of the layered structure of the semiconductor epitaxial stacked structure used in the light-emitting diode 10 of Example 3 and FIG. 13 is a schematic cross section illustrating a structure resulting from joining the GaP substrate 14 to the semiconductor epitaxial stacked structure of FIG. 12.

The semiconductor light-emitting diode 10 of Example 3 was a red color Light-Emitting Diode (LED) possessing an AlGaInP light-emitting part 12 and was fabricated by joining an epitaxial stacked structure installed on a semiconductor substrate 11 made of GaAs to the GaP substrate 14.

The light-emitting diode 10 of Example 3 was fabricated by using an epitaxial wafer that was furnished with an epitaxial growth layer 13 composed of semiconductor layers sequentially stacked on the semiconductor substrate 11 formed of an Si-doped n-type GaAs single crystal possessing a surface inclined by 15° from the (1000) face. The epitaxial growth layer 13 was configured by sequentially stacking component semiconductor layers, i.e. a buffer layer 130B formed of an Si-doped n-type GaAs, a contact layer 131 formed of Si-doped n-type $(Al_{0.5}Ga_{0.5})_{0.5}In_{0.5}P$, a lower clad layer 132 formed of Si-doped n-type $(Al_{0.7}Ga_{0.3})_{0.5}In_{0.5}P$, a light-emitting layer 133 formed of 20 pairs of undoped $(Al_{0.2}Ga_{0.8})_{0.5}In_{0.5}P$ and $(Al_{0.7}Ga_{0.3})_{0.5}In_{0.5}P$, an upper clad layer 134 formed of Mg-doped p-type $(Al_{0.7}Ga_{0.3})_{0.5}In_{0.5}P$ and an Mg-doped p-type GaP layer 135.

The semiconductor layers 130B~135 were individually stacked by the low-pressure MetalOrganic Chemical Vapor Deposition method (MOCVD method) in the same manner as when the semiconductor layers 130A~135 forming the epitaxial growth layer 13 of Example 1 were stacked. Consequently, an epitaxial wafer to be used in Example 3 was formed.

The GaAs buffer layer 130B had a carrier concentration of about $2\times10^{18}$ cm$^{-3}$ and a layer thickness of about 0.2 μm. The contact layer 131 had a carrier concentration of about $2\times10^{18}$ cm$^{-3}$ and a layer thickness of about 1.5 μm. The n-clad layer 132 had a carrier concentration of about $8\times10^{17}$ cm$^{-3}$ and a layer thickness of about 1 μm. The undoped light-emitting layer 133 had a thickness of 0.8 μm. The p-clad layer 134 had a carrier concentration of about $2\times10^{-3}$ cm$^{-3}$ and a layer thickness of 1 μm. The GaP layer 135 had a carrier concentration of about $3\times10^{18}$ cm$^{-3}$ and a layer thickness of 9 μm.

The p-type GaP layer 135 had a region reaching a depth of about 1 μm from the first surface polished till a specular finish. By the specular finish, the surface of the p-type GaP layer 135 was made to reach a roughness of 0.18 nm.

Meantime, the n-type GaP substrate 14 to be mounted on the surface of mirror finish of the p-type GaP layer 135 was prepared. The mounting GaP substrate 14 needed for the fabrication of the light-emitting diode 10 of Example 3 was prepared in the same manner as that was used in the fabrication of the light-emitting diode 10 of Example 1.

The GaP substrate 14 and an epitaxial wafer were carried into an ordinary device for mounting a semiconductor material and the interior of this device was evacuated till a vacuum of $3\times10^{-5}$ Pa. Thereafter, the GaP substrate 14 disposed inside the device that had expelled members made of a carbonaceous material with a view to avoiding contamination with carbon was heated in the vacuum to a temperature of about 800° C. while the surface of the GaP substrate 14 was exposed to Ar ions accelerated to an energy of 800 eV. As a result, a joining layer 141 having a nonstoichiometric composition was formed on the surface of the Gap substrate 14. Subsequent to the formation of the joining layer 141, the radiation of the Ar ions was stopped and the GaP substrate 14 was cooled to room temperature.

Next, the first surfaces of both the GaP substrate 14 furnished in the surface region with the joining layer 141 made of a nonstoichiometric composition and the GaP layer 135 were exposed over a period of three minutes to an Ar beam neutralized by collision with electrons. Thereafter, inside the mounting device maintained in a vacuum, the surfaces of the GaP layer 135 and the GaP substrate 14 were overlapped and given such a load as to exert a pressure of 20 g/cm$^2$ on each of the surfaces and both the substrate and the layer were consequently joined at room temperature (refer to FIG. 13). When the joined wafers were extracted from the vacuum chamber of the mounting device and their interface was analyzed, it was found that the joining layer 141 of $Ga_{0.6}P_{0.4}$ having a nonstoichiometric composition was formed in the interface. The joining layer 141 had a thickness of about 3 nm, an oxygen atom concentration of $7\times10^{18}$ cm$^{-3}$, a magnitude found by the ordinary method of SIMS, and a carbon atom concentration of $9\times10^{18}$ cm$^{-3}$.

Next, the semiconductor substrate 11 and GaAs buffer layer 130B were selectively removed from the joined wafers with an ammonia-based etchant.

For the purpose of forming the ohmic electrode 15 as the first electrode on the surface of the contact layer 131, first an AuGeNi alloy was deposited in a thickness of 0.5 μm, Pt was deposited in a thickness of 0.2 μm, and Au was deposited in a thickness of 1 μm by the vacuum evaporation method to produce an n-type ohmic electrode. Then, this n-type ohmic electrode was subjected to patterning by the ordinary means of photolithography to form the first electrode 15.

Next, the semiconductor layers 131~134 in the region for forming the p-electrode were selectively removed to expose the GaP layer 135. On the surface of the GaP layer 135, AuBe and Au were deposited in respective thicknesses of 0.2 μm and 1 μm to form a p-type ohmic electrode by subjecting their metallic materials to the method of vacuum evaporation. Further, by having these electrodes alloyed by a heat treatment performed at 450° C. for 10 minutes, the first electrode 15 as a low-resistance n-type ohmic electrode and the second electrode 16 as a p-type ohmic electrode were formed (refer to FIG. 10 and FIG. 11).

Next, from the back surface of the GaP substrate 14, a V-shaped groove was inserted by using a dicing saw so as to give an angle of 70° (the angle α formed by the second side face 143 and the surface parallel to the light-emitting surface) to an inclined face and a size of 80 μm to the first side face 142.

Then, from the first surface side, cuts were inserted at intervals of 350 μm to produce chips. The broken layer and the contaminant caused by the dicing were etched and removed by using a mixed liquid of sulfuric acid and hydrogen peroxide to complete fabrication of the semiconductor light-emitting diode (chips) 10.

Figure 14:
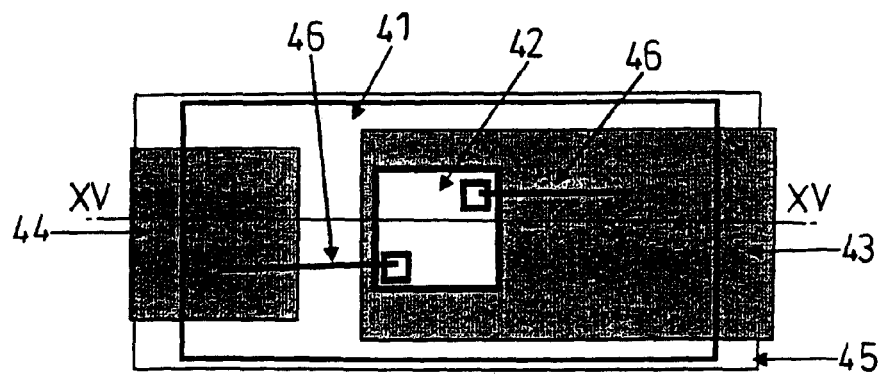
FIG. 14 is a schematic plan view of a semiconductor light-emitting diode lamp 1 using the semiconductor light-emitting diode 10 of Example 3 as an LED chip 42.
Figure 15:
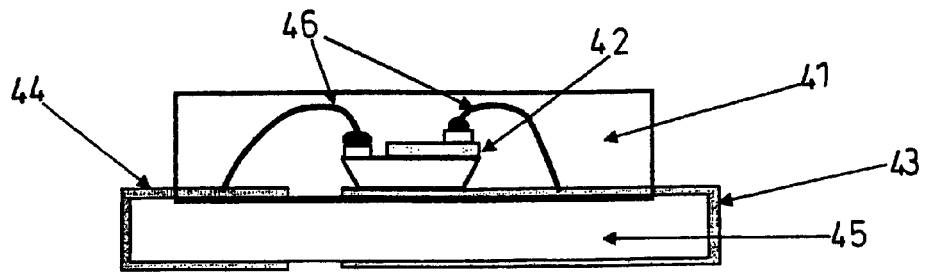
FIG. 15 is a schematic cross section taken through FIG. 14 along line XV-XV.

By using as the LED chips 42 the semiconductor light-emitting diodes 10 that had been fabricated as described above, the semiconductor Light-Emitting Diode lamp (LED lamp) 1 was assembled as illustrated schematically in FIG. 14 and FIG. 15. This LED lamp 1 was manufactured by fixing and mounting the LED chip 42 on the mounting substrate 42 with silver (Ag) paste, wire-bonding the n-type ohmic electrode 15 of the LED chip 42 over the n-electrode terminal 43 disposed on the first surface of the mounting substrate 45 and the p-type ohmic electrode 16 over the p-electrode terminal 44 respectively with the gold wire 46, and thereafter sealing the joined faces with the ordinary epoxy resin 41. Incidentally, aluminum nitride possessing an excellent exoergic property was used as the base material for the mounting substrate 45. The ohmic electrode 15 comprises a pad electrode 15a and a linear electrode 15b.

When an electric current was made to pass between the n-type and p-type ohmic electrodes 15 and 16 via the n-electrode terminal 43 and the p-electrode terminal 44 installed on the surface of the mounting substrate 45, a red color light having a main wavelength of 620 nm was emitted. The forward voltage (Vf) that occurred during the passage of an electric current of 20 mA in the forward direction reached about 1.95 V, a magnitude reflecting the good ohmic properties of the ohmic electrodes 15 and 16. The intensity of light emission that occurred when the forward electric current was set at 20 mA reached high brightness of 600 mcd, a magnitude reflecting the structure of the light-emitting part having a high efficiency of light emission and the enhancement of the efficiency of extraction to the exterior owing to the removal of the broken layer taking place during the cutting into chips.

Example 4

Now, as a still another concrete example of the third embodiment, the light-emitting diode according to Example 4 will be described below by reference to the drawings.

Figure 16:
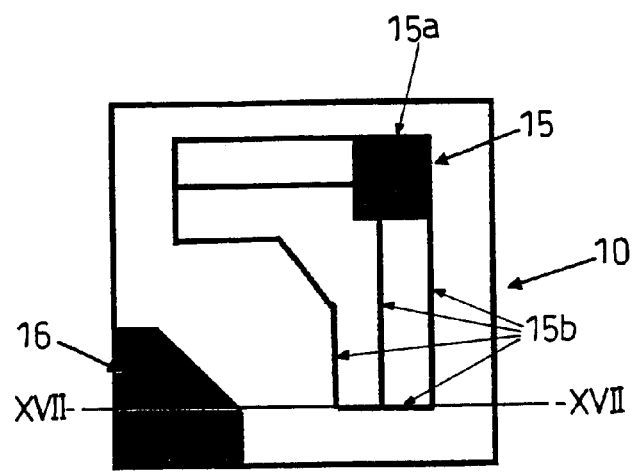
FIG. 16 is a schematic plan view of a semiconductor light-emitting diode 10 of Example 4.
Figure 17:
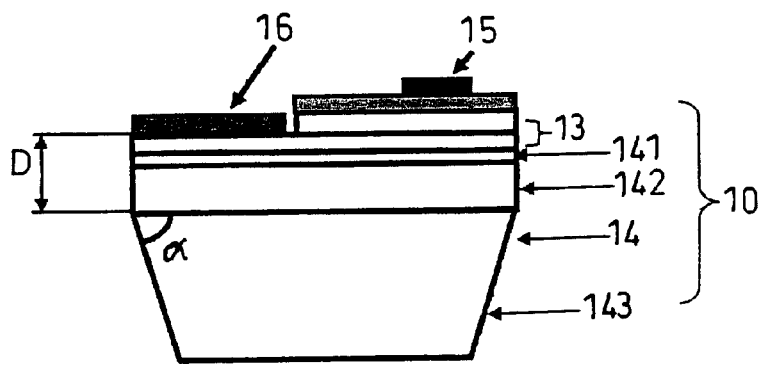
FIG. 17 is a schematic cross section taken through FIG. 16 alone line XVII-XVII.

The semiconductor light-emitting diode 10 of Example 4 was a red color Light-Emitting Diode (LED) furnished with an AlGaInP light-emitting part 12 and was fabricated by bonding an epitaxial stacked structure disposed on the semiconductor substrate 11 made of GaAs to the GaP substrate 14 (refer to FIG. 16 and FIG. 17). FIG. 16 is a plan view thereof and FIG. 17 is a cross section taken across FIG. 16 along line XVII-XVII.

The semiconductor light-emitting diode 10 of Example 4 was fabricated by using the same semiconductor epitaxial stacked structure as used in the light-emitting diode of Example 3 and following the same method of production as used in Example 3.

The light-emitting diode 10 of Example 4 was constructed similarly to the light-emitting diode 10 of Example 3, except the second electrode 16 was formed at the position of a corner on the compound semiconductor layer on the side opposite the first electrode 15 and the electrodes 15 and 16 were disposed in this manner.

That is, the light-emitting diode 10 of Example 4 was so constructed that the side face of the GaP substrate 14 serving as a transparent substrate formed a first side face 142 nearly perpendicular to the light-emitting surface of the light-emitting layer 133 at the portion on the side near the light-emitting layer 133 and a second side face 143 inclined to the light-emitting surface at the portion on the side distant from the light-emitting layer 133 and the second side face 143 was inclined with an angle α toward the inner side of the semiconductor layer.

The semiconductor Light-Emitting Diode lamp (LED lamp) 1 possessing a structure illustrated schematically in FIG. 14 and FIG. 15 was fabricated by using as the LED chips 42 the semiconductor light-emitting diode 10 of Example 4 and following the same procedure as in the case of using the semiconductor light-emitting diode 10 of Example 3.

When an electric current was made to pass between the n-type and p-type ohmic electrodes via the n-electrode terminal 43 and the p-electrode terminal 44 installed on the surface of the mounting substrate 45, a red color light having a main wavelength of 620 nm was emitted. The forward voltage (Vf) that occurred during the passage of an electric current of 20 mA in the forward direction reached about 2.10 V, a magnitude reflecting the good ohmic properties of the ohmic electrodes 15 and 16. The intensity of light emission that occurred when the forward electric current was set at 20 mA reached high brightness of 800 mcd, a magnitude reflecting the structure of the light-emitting part having a high efficiency of light emission and the enhancement of the efficiency of extraction to the exterior owing to the removal of the broken layer taking place during the cutting into chips.

Comparative Example 3

Figure 18:
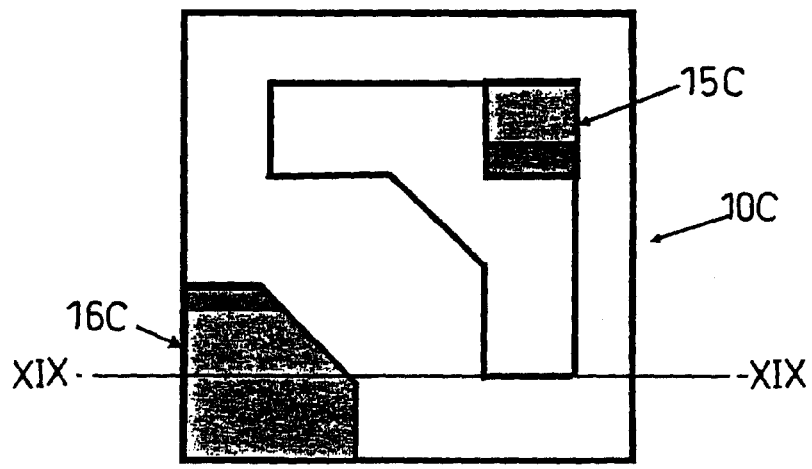
FIG. 18 is a schematic plan view of a semiconductor light-emitting diode C of Comparative Example 3.
Figure 19:
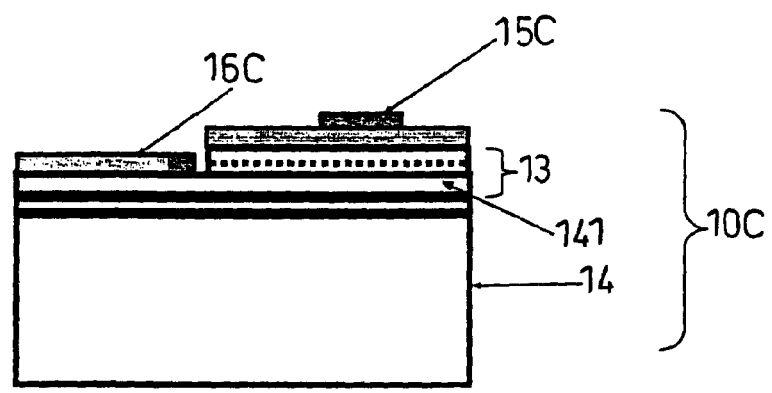
FIG. 19 is a schematic cross section taken through FIG. 18 along line XIX-XIX.

A semiconductor light-emitting diode 10C of Comparative Example 3 illustrated in FIG. 18 and FIG. 19 was fabricated by joining the transparent substrate 14 to the semiconductor layer in accordance with the same method of production as in Example 3, except the second side face of the transparent substrate 14 was formed perpendicularly to the light-emitting part 13 as illustrated in FIG. 19. Incidentally, an n-type ohmic electrode 15c formed on the surface of the contact layer 131 was not shaped in a reticular pattern as shown in FIG. 18 and a p-type ohmic electrode 16c formed on the surface of the GaP layer 135 was so shaped as to have part of the periphery thereof covered with a compound semiconductor layer.

The semiconductor light-emitting diode of Comparative Example 3 had been obtained as a chip identical in size with the diode of Example 3. Subsequent to the cutting, the broken layer and the contaminant produced by the work of dicing were etched and removed with a mixed liquid of sulfuric acid and hydrogen peroxide.

A semiconductor Light-Emitting Diode lamp (LED lamp) having a structure illustrated schematically in FIG. 14 and FIG. 15 was assembled by following the procedure of using the semiconductor light-emitting diode 10 in Example 3 except using the semiconductor light-emitting diode 10C of Comparative Example 3.

The LED lamp using the semiconductor light-emitting lamp 10C of Comparative Example 3, when an electric current was passed between the n-type and p-type ohmic electrodes 15c and 16c via the n-electrode terminal 43 and the p-electrode terminal 44 disposed on the surface of the mounting substrate 45, emitted a red color light having a main wavelength of 620 nm. The forward voltage (Vf) occurring during the passage of an electric current of 20 mA in the forward direction reached about 2.30 V. The intensity of light emission that occurred when the forward electric current was set at 20 mA barely reached brightness of 200 mcd.

INDUSTRIAL APPLICABILITY

The light-emitting diode of this invention is characterized by excelling in the exoergic property and exhibiting high brightness and, owing to the superior exoergic property, can be used with a large electric power. Further, the light-emitting diode of this invention is capable of emitting light in red color, orange color, yellow color or yellowish green color.

The invention claimed is:

1. A light-emitting diode possessing a transparent substrate and a light-emitting layer made of a compound semiconductor,
    wherein an area (A) of a light-extracting surface having formed thereon a first electrode and a second electrode differing in polarity from the first electrode, an area (B) of the light-emitting layer formed approximate to the light-extracting surface, and an area (C) of a back surface of the light-emitting diode falling on a side opposite a side for forming the first electrode and the second electrode are so related as to satisfy a relation of formula A>C>B,
    the transparent substrate possesses a side face comprising a first side face approximate to the light-emitting layer, and a second side face approximate to a back surface of the transparent substrate, and
    the first side face has an angle of inclination, with respect to a first direction being substantially perpendicular to the back surface of the transparent substrate, smaller than an angle of inclination of the second side face, with respect to the first direction.

2. A light-emitting diode according to claim 1, wherein the light-emitting layer has a composition of formula $(Al_XGa_{1-X})_Y In_{1-Y}P$; wherein $0 \leq X \leq 1$, $0 \leq Y \leq 1$, and the transparent substrate has a heat transfer coefficient not less than 100 W/m·k.

3. A light-emitting diode according to claim 1, wherein the first side face is perpendicular to a top surface of the light-emitting layer, and the second side face is slanted with respect to the first direction.

4. A light-emitting diode according to claim 1, wherein the angle of inclination of the second side face is between 10 degrees and 30 degrees.

5. A light-emitting diode according to claim 1, wherein the angle of inclination of the second side face is between 10 degrees and 20 degrees.

6. A light-emitting diode according to claim 1, wherein the first side face has a length between 50 μm and 100 μm and the second side face has a length between 100 μm and 250 μm.

7. A light-emitting diode according to claim 1, wherein the transparent substrate is made of gallium phosphide (GaP).

8. A light-emitting diode according to claim 1, wherein the transparent substrate has a back surface that is a coarsened surface capable of scattering light.

9. A light-emitting diode according to claim 8, wherein the transparent substrate is a GaP substrate the back surface thereof results from treatment of the GaP substrate with hydrochloric acid.

10. A light-emitting diode according to claim 1, wherein the transparent substrate has a back surface having a metal film formed thereon.

11. A light-emitting diode according to claim 10, wherein the metal film on the back surface of the transparent substrate contains a metal having a melting point of 400° C. or less.

12. A light-emitting diode according to claim 10, wherein the metal film is made of an AuSn alloy.

13. A light-emitting diode according to claim 1, wherein the light-emitting diode is used with an electric power not less than 1.5 W and the area of the back surface thereof is not less than 0.6 mm$^2$.

14. A light-emitting diode according to claim 1, wherein the first and second side faces of the transparent substrate are those formed by the dicing method.

* * * * *